(12) United States Patent
Agraffeil

(10) Patent No.: US 9,478,424 B2
(45) Date of Patent: Oct. 25, 2016

(54) METHOD FOR FABRICATING AN IMPROVED GAN-BASED SEMICONDUCTOR LAYER

(71) Applicant: COMMISSARIAT À L' ÉNERGIE ATOMIQUE ET AUX ÉNERGIES ALTERNATIVES, Paris (FR)

(72) Inventor: Claire Agraffeil, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/849,237

(22) Filed: Sep. 9, 2015

(65) Prior Publication Data

US 2016/0093496 A1    Mar. 31, 2016

(30) Foreign Application Priority Data

Sep. 26, 2014   (FR) ..................................... 14 59132

(51) Int. Cl.
| | | |
|---|---|---|
| H01L 21/20 | (2006.01) | |
| H01L 21/265 | (2006.01) | |
| H01L 21/22 | (2006.01) | |
| H01L 21/324 | (2006.01) | |
| H01L 21/02 | (2006.01) | |

(52) U.S. Cl.
CPC ..... *H01L 21/26546* (2013.01); *H01L 21/0254* (2013.01); *H01L 21/02389* (2013.01); *H01L 21/02634* (2013.01); *H01L 21/22* (2013.01); *H01L 21/3245* (2013.01)

(58) Field of Classification Search
CPC .................................................. H01L 21/26546
USPC ........................................................... 438/478
See application file for complete search history.

(56) References Cited

U.S. PATENT DOCUMENTS

| | | |
|---|---|---|
| 5,306,662 A | 4/1994 | Nakamura et al. |
| 5,766,695 A | 6/1998 | Nguyen et al. |
| 2006/0286784 A1 | 12/2006 | Usov et al. |
| 2007/0134834 A1 | 6/2007 | Lee et al. |
| 2007/0269968 A1 | 11/2007 | Saxler et al. |
| 2010/0133656 A1 | 6/2010 | Hager, IV et al. |
| 2010/0147835 A1 | 6/2010 | Mulpuri et al. |
| 2010/0171126 A1 | 7/2010 | Briere |
| 2012/0068188 A1 | 3/2012 | Feigelson et al. |

(Continued)

FOREIGN PATENT DOCUMENTS

WO    82/01619 A1    5/1982

OTHER PUBLICATIONS

Cayrel, F. et al. "Si implanted in GaN grown on sapphire using AlN and oxide cap layers," Nuclear Instruments & Methods in Physics Research, Section-B/Beam Interactions With Materials and Atoms, vol. 272, pp. 137-140, 2012.

(Continued)

*Primary Examiner* — Anthony Ho
(74) *Attorney, Agent, or Firm* — Oliff PLC

(57) ABSTRACT

The invention relates to a post-activation method of dopants in a doped and activated GaN-base semiconductor layer, including the following successive steps: providing said doped and activated substrate, eliminating a part of the semiconductor material layer.

24 Claims, 3 Drawing Sheets

(56) References Cited

U.S. PATENT DOCUMENTS

2013/0056793 A1    3/2013    Srinivasan
2016/0061528 A1    3/2016    Derenge

OTHER PUBLICATIONS

Lorenz, K et al. "High-temperature anealing and optical activation of Eu-implanted GaN," Applied Physics Letters, American Institute of Physics, vol. 85, No. 14, pp. 2712-2714, 2004.

Hager, C. E. et al. "Activation of ion implanted Si in GaN using a dual AlN annealing cap," J. Appl. Phys., vol. 105, pp. 033713-1 to 033713-7, 2009.

Miranda, S. M. C. et al, "Sequential multiple-step europium ion implantation and annealing of GaN," Physica Status Solidi (C), vol. 11, No. 2, pp. 253-257, 2014.

Chan, J. S. et al, "Thermal Annealing Characteristics of Si and Mg-implanted GaN thin films," Applied Physics Letters, American Institute of Physics, vol. 68, No. 19, pp. 2702-2704, 1996.

Nogales, E. et al, "Failure Mechanism of AlN nanocaps used to protect rare earth-implanted GaN during high temperature annealing," Applied Physics Letters, American Institute of Physics, vol. 88, No. 3, pp. 031902-1 to 031902-3, 2006.

Porowski, et al, "Annealing of GaN Under High Pressure of Nitrogen," Journal of Physics: Condensed Matter, vol. 14, pp. 11097-11110, 2002.

Feigelson, et al, "Multicycle Rapid Thermal Annealing Technique and its Application for the Electrical Activation of Mg Implanted in GaN," Journal of Crystal Growth, vol. 350, pp. 21-26, 2012.

Aluri, et al, "Microwave Annealing of Mg-implanted and in situ Be-doped GaN," Journal of Applied Physics, American Institute of Physics, vol. 108, No. 8, pp. 083103-1 to 083103-7, 2010.

Hwang, et al, "Enhancing P-Type Conductivity in Mg-Doped GaN Using Oxygen and Nitrogen Plasma Activation," Japanese Journal of Applied Physics, Japan Society of Applied Physics, vol. 44, No. 4A, pp. 1726-1729, 2005.

Kim, et al, "Reactivation of Mg Acceptor in Mg-doped GaN by Nitrogen Plasma Treatment," Applied Physics Letters, American Institute of Physics, vol. 76, No. 21, pp. 3079-3081, 2000.

Shintani, et al, "Etching of GaN Using Phosphoric Acid," Journal of the Electrochemical Society, vol. 123, No. 5, pp. 706-713, 1976.

Gupta, "Plasma Immersion Ion Implantation (PIII) Process-Physics and Technology," International Journal of Advancements in Technology, vol. 2, No. 4, pp. 471-490, 2011.

Wu, et al, "Positive and Negative Effects of Oxygen in Thermal Annealing of p-type GaN," Semiconductor Science Technology, vol. 27, 085017, pp. 1-3, 2012.

Nomoto, et al, "Remarkable Reduction of On-Resistance by Ion Implantation in GaN/AlGaN/GaN HEMTs with Low Gate Leakage Current," IEEE Electron Device Letters, IEEE Service Center, vol. 28, No. 11, pp. 939-941, 2007.

International Business Machines Corp., "Three-Dimensional Semiconductor Device Structures Using Channeled Ion Implantation and Annealing Techniques," IBM Technical Disclosure Bulletin, vol. 32, No. 4A, pp. 358-359, 1989.

Whelan, et al, "The Dependence of the Radiation Damage Formation on the Substrate Implant Temperature in GaN during Mg ion implantation," Journal of Applied Physics, American Institute of Physics, vol. 98, No. 1, pp. 013515-1 to 013515-5, 2005.

International Business Machines Corp., "Forming of Low Resistance Ohmic Contacts to III-V Semiconductors," IBM Technical Disclosure Bulletin, vol. 32, No. 7, pp. 141-142, 1989.

Anonymous, "Barrier Height Enhancement by Recoil Implantation," Research Disclosure, Mason Publications, No. 292, pp. 932, 1988, XP000104853, ISSN:0374-4353.

Cao, et al, "Implanted p-n junctions in GaN," Solid State Electronics, vol. 43, pp. 1235-1238, 1999.

Baharin, et al, "Experimental and Numerical Investigation of the Electrical Characteristics of Vertical n-p Junction Diodes Created by Si Implantation into p-GaN," Institute of Electrical and Electronics Engineers, pp. 12-15, 2008.

U.S. Appl. No. 14/846,376, filed Sep. 4, 2015 in the name of Agraffeil.

U.S. Appl. No. 14/859,860, filed Sep. 21, 2015 in the name of Agraffeil.

U.S. Appl. No. 14/855,761, filed Sep. 16, 2015 in the name of Agraffeil.

Mar. 24, 2016 Office Action issued in U.S. Appl. No. 14/859,860.
Apr. 20, 2016 Office Action Issued in U.S. Appl. No. 14/846,376.
Jun. 15, 2016 Office Action issued in U.S. Appl. No. 14/855,761.

METHOD FOR FABRICATING AN IMPROVED GAN-BASED SEMICONDUCTOR LAYER

BACKGROUND OF THE INVENTION

The invention relates to production of a semiconductor layer made from n-doped or p-doped GaN.

STATE OF THE ART

Ion implantation is commonly used to dope semiconductor materials, and the nature of the implanted ions is chosen according to the type of doping that is desired to be obtained.

$Si^+$ ions are often used to perform n-doping (excess electrons) in GaN-base semi-conductors, whereas $Mg^+$ ions are for example used to perform p-doping (excess holes). Efficient p-doping by means of $Mg^+$ ions is difficult to achieve, and it is therefore preferable to perform a Mg/P, Mg/N or Be/O co-implantation.

After implantation, the semiconductor then undergoes heat treatment in order to activate the dopant impurities more or less efficiently.

However, heat treatment may impair the surface of the semiconductor material if the latter is sensitive to temperature effects. For example, GaN is a semiconductor the surface of which may be impaired when the annealing temperature is higher than 850° C. Cracks or holes can appear at the surface of the semiconductor material, in particular when the heat treatment is performed at a temperature of more than 1000° C. for a period of more than a few minutes.

Heat treatment also generates diffusion of the dopants from the semiconductor matrix, but also causes contamination of the semiconductor by atoms such as H, O, and Si (when the semiconductor is deposited on a silicon substrate or in more general manner in contact with silicon). These atoms diffuse into the semiconductor matrix and generate a self-compensation of the n-doping or p-doping, which limits the activation rate of the dopant ions in the semiconductor.

To prevent impairment of the semiconductors and to increase the activation rate of the dopant ions after implantation, a protection layer, referred to as cap layer, can be deposited on top of the semiconductor. This deposition has to be performed before the heat treatment is performed. The cap layer enables the semiconductor to be annealed at a higher temperature than that which it would be able to withstand if it was bare, thereby enabling a doped semiconductor having less structural defects and a better activation rate to be obtained.

GaN-base semiconductor materials therefore appear to be particularly fragile materials, and in spite of the precautions taken, the electric properties of the semiconductor material are insufficient for industrial use, in particular if the semiconductor is p-doped.

OBJECT OF THE INVENTION

One object of the invention consists in implementing a method for producing a semiconductor material designed to improve its electric performances.

For this purpose, the method for fabricating a substrate comprising a layer made from doped and activated GaN-base semiconductor material comprises the following successive steps:

providing said doped and activated substrate,
eliminating a part of the semiconductor material layer.

According to one implementation, the elimination step can be followed by a first heat treatment performed in an atmosphere containing nitrogen and devoid of hydrogen.

In preferential manner, the first heat treatment step can be followed by an implantation step of second dopant impurities. This step can be performed by ion implantation or by immersion in a nitrogen plasma. The implanted dose can advantageously be less than ⅔ of the dose initially implanted in the semiconductor material layer.

The method can also comprise a second heat treatment performed in an atmosphere containing nitrogen and devoid of hydrogen.

The method can also comprise a deposition step of an additional layer of GaN-base semiconductor material by epitaxial growth on the semiconductor material layer.

Deposition of the additional GaN-base semiconductor material layer can finally be followed by an additional heat treatment performed in an atmosphere containing nitrogen.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

The fabrication method is implemented on a GaN-base semiconductor material layer 1b. In the illustrated example, the method is implemented on a substrate 1 which advantageously comprises a support 1a for example made from silicon, sapphire, Al2O3, or SiC, and a GaN semiconductor material layer 1b. GaN-base semiconductor material layer 1b is doped with electrically dopant atoms and the latter have been activated, for example by means of high-temperature annealing.

Substrate 1 is advantageously doped by implantation of first dopant impurities 3 of Mg type or by a co-implantation of $Mg^+$ and $Si^+$ ions. The dose of first dopant impurities 3 is preferably comprised between $1.10^{14}$ and $1.10^{16}$ atoms/cm².

Figure 1:
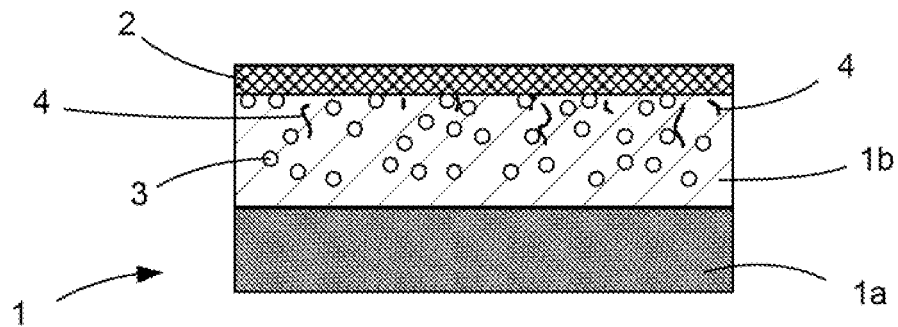
FIGS. 1 to 8 illustrate in schematic manner an embodiment of the method for performing post-activation of dopants implanted in a GaN-base semiconductor layer.

Substrate 1 can have been covered by a cap layer 2 designed to protect semiconductor material layer 1b when the activation heat treatment of the first dopant impurities 3 is performed. Cap layer 2 then forms a barrier configured to prevent evaporation of nitrogen molecules from semiconductor material layer 1b during the heat treatment (cf. FIG. 1).

When substrate 1 is a bulk GaN block, it is possible to cover the back surface with a cap layer 2 advantageously identical to that deposited on substrate 1 on the front surface. The front surface of substrate 1 is defined here as the surface impacted by the beam of dopant impurities, and the back surface as being the surface opposite the front surface.

According to the embodiments, cap layer 2 can be formed before or after the implantation step of the first dopant impurities.

Cap layer 2 can advantageously be silicon-base when the doping sought to be achieved is n-doping. What is meant by silicon-base is that the cap layer comprises at least 30% atomic of silicon. The material can then be $SiO_2$ or $Si_3N_4$. A silicon-base cap layer is particularly advantageous if an n-doping is sought for. When heat treatment is performed, atoms of Si type can diffuse in the direction of semiconductor material layer 1b to enhance the n-doping.

The material of cap layer 2 can also be devoid of silicon atoms. Advantageously, cap layer 2 is made from AlN. Cap layer 2 enables contamination of semiconductor layer 1b by silicon or oxygen molecules to be prevented. The cap layer for example enables a p-doping of layer 1b to be preserved.

Figure 2:
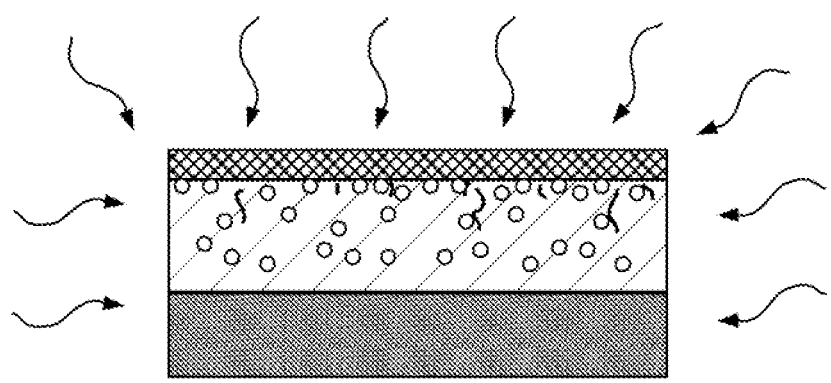

If the doping is performed by means of ion implantation, the ion implantation will have created structural defects 4 in the semiconductor matrix. An activation heat treatment preferably implemented at a temperature of more than 1000° C. is performed after implantation (cf. FIG. 2). This heat treatment enables the first dopant impurities 3 to be activated and the structural defects 4 to be partially repaired. The electric quality of semiconductor material layer 1b can be improved as there is a larger proportion of electrically active dopants and at least a part of the structural defects have been cured.

However, semiconductor material layer 1b can also have been impaired by the different technological steps to which it has been subjected up to this point, and in particular the implantation and high-temperature heat treatment steps.

The use of cap layer 2 as diffusion barrier results in an accumulation of the dopant species at the surface of layer 1b during the heat treatment. This accumulation of dopant species creates an inhomogeneous chemical composition of the surface of semiconductor material layer 1b, in particular when cap layer 2 is made from AlN or from $SiO_2$. It has been discovered that activation heat treatment also causes an increase of the roughness at the interface between substrate 1 and cap layer 2.

To improve the electric performances of layer 1b, it is particularly advantageous to improve the crystallographic quality of semiconductor material layer 1b and more particularly of the surface of semiconductor material layer 1b. For this, several specific technological steps can be performed.

Figure 3:
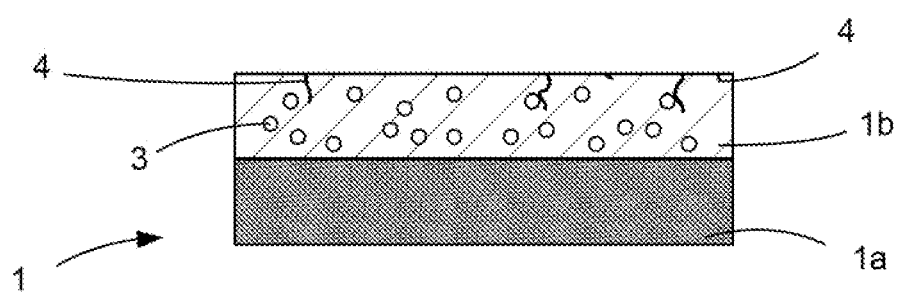

The top part of layer 1b being the most damaged and/or the most contaminated area, it is advantageous to eliminate not only cap layer 2 but also a part of layer 1b (see FIG. 3). The value of the thickness removed from layer 1b depends on the process to which it was subjected beforehand. However, it appears advantageous to remove a portion of layer 1b having a thickness comprised between 1 and 40 nm, preferably 1 to 20 nm, to ensure elimination of a very large proportion of defects and/or contaminants, while at the same time preserving the electrically activated and doped part.

Removal of cap layer 2 and of the top part of semiconductor material layer 1b can for example be performed by Chemical Mechanical Polishing (CMP).

Chemical mechanical polishing consists in polishing the surface of a part by exerting a load pressure on a rotating part. Polishing is preferably performed in the presence of a slurry able to contain abrasive particles and particles designed to perform chemical etching.

To remove cap layer 2 and the top part of semiconductor material layer 1b, substrate 1 is secured on a plate which is set in motion. A pressure advantageously comprised between 0.1 and 0.5 kg/cm is applied on substrate 1 so as to keep it in contact with the plate.

As far as the slurry is concerned, the latter can comprise 1 to 5% of $Al_2O_3$ shot, or 0.1 to 30% of silica shot. The $Al_2O_3$ and silica act as an abrasive and contribute to stripping of cap layer 2 when the plate is made to rotate with respect to substrate 1.

To perform chemical etching of cap layer 2, the pH of the slurry can be comprised between 2 and 11 and preferably be equal to 10. The slurry can for example be an ammonia-based solution.

When cap layer 2 and a sufficient thickness of semiconductor material layer 1b have been eliminated, substrate 1 is rinsed in order to remove the abrasive particles that may be present at its surface. The rinsing solution can be an ammonia solution.

As a variant, cap layer 2 can be eliminated by chemical mechanical polishing implementing a first set of operating conditions and layer 1b can be partially eliminated by chemical mechanical polishing implementing a second set of operating conditions different from the first set.

In alternative manner, cap layer 2 and the top part of semiconductor material layer 1b can be removed by chemical etching or by physical etching. It is possible to perform plasma etching and/or wet process etching.

It can also be envisaged to remove cap layer 2 by chemical mechanical polishing and to remove the top part of semiconductor material layer 1b by means of another technique, or vice-versa.

Figure 4:
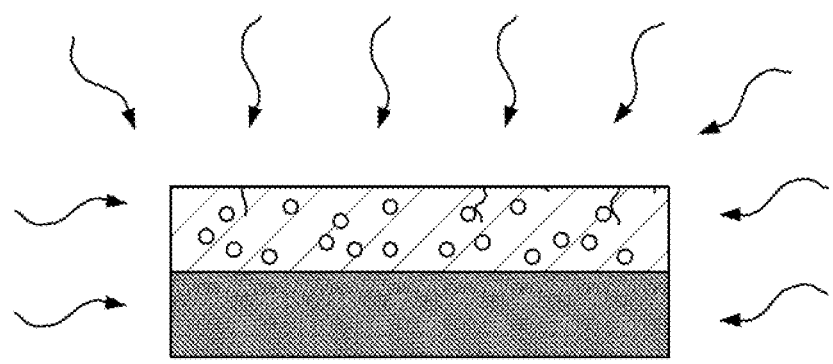

Substrate 1 which is henceforth bare can advantageously be subjected to a first heat treatment designed to restructure the damaged surface of semiconductor material layer 1b and to eliminate the hydrogen present in the semiconductor matrix (cf. FIG. 4). There is in fact no longer any cap layer preventing outgassing of the $H_2$ gas.

If Mg+ ions have been input to layer 1b, for example by implantation, the first heat treatment can also be configured to cause dissociation of the Mg—H complexes created when the heat treatment for activation of the first dopant impurities 3 was performed.

The first heat treatment of the surface can be performed by a method referred to as "conventional" heat treatment (furnace annealing), or by Rapid Thermal Annealing (RTA) and Rapid Thermal Processing (RTP).

For example, when the first heat treatment is performed by conventional techniques, it may be advantageous to perform this treatment in an atmosphere advantageously devoid of hydrogen to increase the hydrogen outgassing. The annealing atmosphere advantageously contains nitrogen and can be a mixture of nitrogen and oxygen and can also contain Ar, He or $NF_3$.

The temperature of the first heat treatment can advantageously be comprised between 600 and 850° C. and preferentially be equal to 750° C. The treatment time can be comprised between 5 and 120 min, and preferentially be equal to 20 min. The choice of the heat treatment technique used and of the associated parameters can advantageously be made according to the type of dopant impurities 3, the quantity of structural defects 4 in semiconductor material layer 1b, and the dimensions of the latter.

Figure 5:
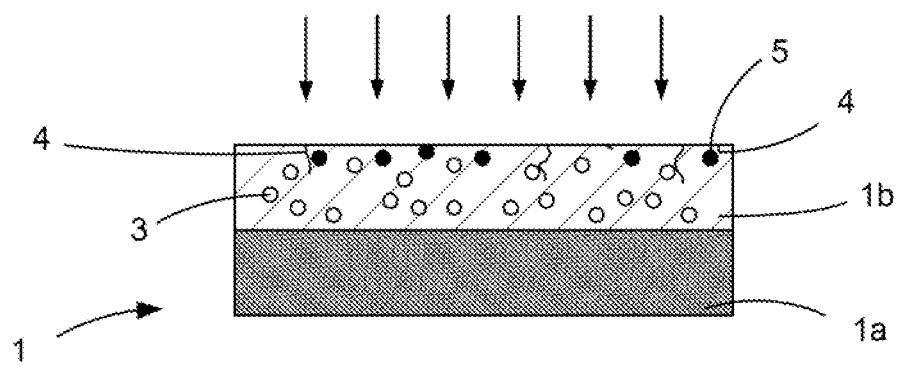

It is apparent that a part of the defects generally present in semiconductor layer 1b are vacancies. To fill the latter, it is advantageous to perform implantation of second dopant impurities 5 (cf. FIG. 5). This can be achieved by any suitable technique and for example by an ion gun or by Plasma Immersion Ion Implantation (PIII). Second dopant impurities 5 are advantageously electrically active or non-electrically active elements designed to fill the vacancies, and can be $N^+$ or $P^+$ ions or a mixture of $N^+$ and $P^+$ ions.

Within the scope of an ion implantation by means of an ion gun, implantation can advantageously be performed at a temperature comprised between 15 and 700° C. and preferentially equal to 500° C. Remaining within this temperature range makes it possible to avoid entering temperature ranges where the surface of the GaN is impaired and where a nitrogen release is observed, these phenomena being all the more likely to occur as semiconductor material layer 1b is subjected to an ion bombardment. This temperature range therefore facilitates both insertion of second dopant impurities 5 into the matrix during implantation and reorganization of the matrix in the form of a crystal lattice.

The implantation energy of second dopant impurities 5 is advantageously lower than that of first dopant impurities 3 so as to implant dopants 5 mainly at the surface of semiconductor layer 1b, i.e. in the area which is the most damaged.

The inventors further observed that the implanted dose of second dopant impurities 5 preferably has to be less than two thirds of the dose of first dopant impurities 3 implanted in semiconductor material layer 1b. In this way, the vacancies created by the first implantation are filled by the second dopant impurities, without causing any further damage to the material.

The implanted dose of second dopant impurities 5 can advantageously be comprised between $0,1.10^{15}$ and $1,5.10^{15}$ atoms/cm$^2$, and preferably be equal to $0,5.10^{15}$ atoms/cm$^2$. The energy of dopants 5 can further be comprised between 10 and 150 keV, and preferably be equal to 50 keV.

The implanted dose and the implantation energy of the second dopant impurities 5 enable N$^+$ ions to be inserted where the semiconductor matrix 1b is the most damaged in sufficient quantity to repair it. In counter-intuitive manner, the GaN-base semiconductor matrix 1b is restored by high-temperature implantation of a controlled dose of dopant impurities 5 at low energy. The shortcomings of the doping and activation processing steps performed beforehand are thus overcome.

Unlike doping methods of the prior art wherein two types of materials are successively implanted before heat treatment is performed for activation of the dopants, the implantation step of second dopant impurities 5 is subsequent to the first activation heat treatment of the first dopant impurities 3. This enables the dopant losses, in particular of p-type dopants, to be limited thereby improving the quality of the doping. The same area of semiconductor material layer 1b is doped and then annealed and then doped again.

Reconstruction of semiconductor matrix is moreover simpler to implement compared with those of the prior art, when the semiconductor comprises both p-doped areas and other n-doped areas. The second implantation of dopant impurities 5 can in fact be performed directly on the whole of semiconductor material layer 1b without having recourse to an etching mask. This embodiment is particularly advantageous when dopant impurities 5 are not electrically active or are possibly formed by a p-type dopant impurity.

In alternative manner, implantation of second dopant impurities 5 can be performed by immersion in a N$^+$ ion plasma at a temperature comprised between 20 and 500° C., and preferentially equal to 500° C. The implanted dose can advantageously be comprised between $0,1.10^{15}$ and $1,5.10^{15}$ atoms/cm$^2$, and preferentially be equal to $0,5.10^{15}$ atoms/cm$^2$. The implantation energy of second dopant impurities 5 can be comprised between 5 and 40 keV, and preferentially be equal to 30 keV. Implantation by plasma immersion is therefore preferred when defects 4 are mainly located at the surface of substrate 1, as the implantation energies are lower.

Figure 6:
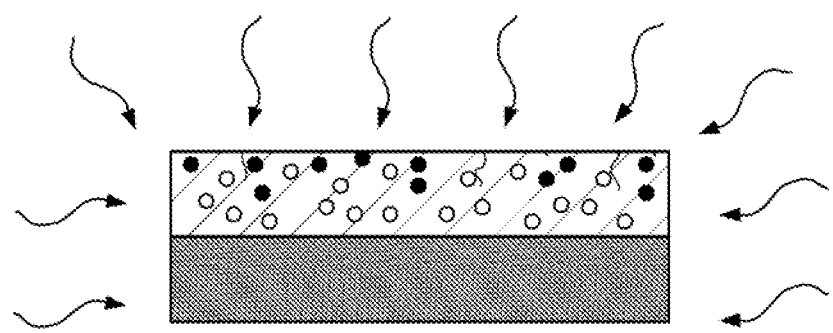

The implantation step creates structural defects in semiconductor material layer 1b, and the latter can therefore advantageously be subjected to a second heat treatment (cf. FIG. 6). This heat treatment also enables H atoms to be eliminated from the semiconductor matrix by outgassing of H$_2$. The combination of an implantation step followed by heat treatment enables the quality of semiconductor matrix 1b to be improved with application of a simple heat treatment.

The second heat treatment can be a treatment of RTA type performed in an atmosphere containing nitrogen and advantageously devoid of hydrogen and oxygen in order to prevent any contamination of semiconductor material layer 1b by H or O atoms, but also to enhance outgassing of hydrogen from the material. The atmosphere in which the heat treatment is performed may contain Ar, He or NF$_3$.

The second heat treatment can be a single annealing or comprise a series of 5 to 40 annealing cycles, each cycle having a time period of 2 to 20 seconds. In a particular embodiment, the second heat treatment can comprise 10 cycles of 5 seconds each.

In alternative manner, the second heat treatment can be a standard annealing performed in an atmosphere devoid of oxygen for a period comprised between 15 and 25 min.

Whatever the method used to perform the second heat treatment, the temperature at which this annealing is performed can be comprised between 600 and 850° C., and preferentially be equal to 750° C. The high temperature of this heat treatment enables the defects of semiconductor layer 1b to be cured by atomic rearrangements, without however causing any evaporation of nitrogen.

Figure 7:
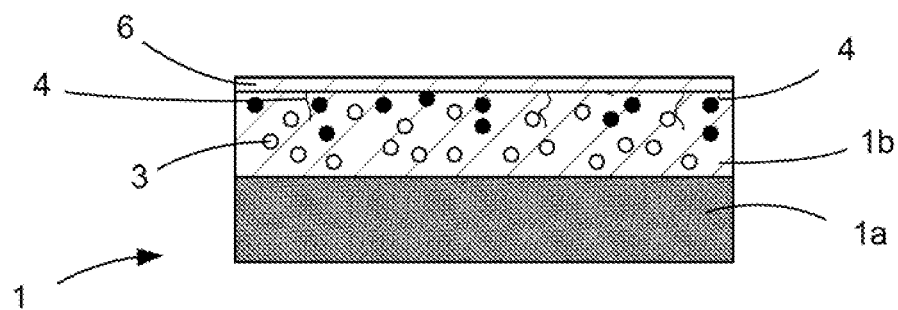

On completion of the second heat treatment, the method can comprise a reconstruction step of the damaged surface of semiconductor material layer 1b (cf. FIG. 7). This reconstruction step can comprise deposition of GaN-base semiconductor material 6 performed for example by Metalorganic Chemical Vapor Deposition (MOCVD) at a temperature comprised between 1000 and 1100° C.

Layer 6 can for example be a layer of AlGaN (i.e. Al(0-50%)Ga(0-50%)N), or of GaN (i.e. Al(0%)Ga(100%)N). Layer 6 can be doped by Mg atoms in the case of p-doping.

The deposited semiconductor material layer 6 can advantageously correspond to a layer having a thickness comprised between 1 and 40 nm. The thickness of layer 6 depends on the use for which substrate 1 is intended, and it is not necessarily identical to the thickness eliminated during the elimination step of the top part of semiconductor layer 1b represented in FIG. 3. This thickness can be comprised between 1 and 40 nm, preferentially comprised between 1 and 20 nm, and ideally be equal to 5 nm.

This thickness enables the electric quality of the semiconductor to be guaranteed. Deposition of the layer being performed at a temperature comprised between 1000 and 1100° C., the electric dopant impurities 3 and 5 can in fact migrate into layer 6 and ensure a similar electric conductivity to that of layer 1b.

Figure 8:
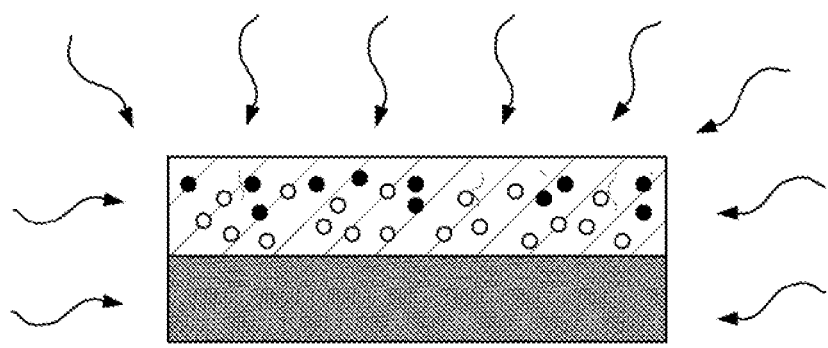

Subsequent to the epitaxy step, it is advantageous to perform a third heat treatment enabling elimination of a part of the hydrogen atoms present in layer 6 (cf. FIG. 8).

The third heat treatment can advantageously be performed in an atmosphere advantageously devoid of hydrogen and oxygen, and containing nitrogen in order to prevent contamination of the GaN-base material by H, O or C atoms. The temperature of the third heat treatment can advantageously be comprised between 750 and 900° C., and preferentially be equal to 800° C. The duration of the heat treatment can be comprised between 15 and 120 min, and preferentially be less than or equal to 20 min when the temperature is 900° C., or be equal to 20 min otherwise.

In advantageous manner, the third heat treatment is performed subsequent to the epitaxy step without layer 6 being subjected to an oxidizing atmosphere. It can advantageously be performed in the susceptor that was used for epitaxy of semiconductor material layer 6.

A semiconductor is thus obtained having a high dopant activation rate and an improved crystal quality, so as to have a material having not only a good electric quality but also an improved surface state, and that is less resistive than in the prior art.

The invention claimed is:

1. A method for fabricating a substrate comprising a layer made from doped and activated GaN-base semiconductor material with first dopant impurities, the method comprising the following successive steps:
providing said doped and activated substrate,
eliminating a part of the semiconductor material layer, and
performing a first heat treatment step in an atmosphere containing nitrogen and devoid of hydrogen.

2. The fabrication method according to claim 1, wherein the first heat treatment is performed at a temperature comprised between 600 and 1000° C., preferentially equal to 750° C.

3. The fabrication method according to claim 1, wherein the first heat treatment is performed for a period comprised between 5 and 120 min.

4. The fabrication method according to claim 1, wherein the first heat treatment is followed by an implantation step of second dopant impurities.

5. The fabrication method according to claim 4, wherein the second dopant impurities are N, P, or a N/P mixture.

6. The fabrication method according to claim 4, wherein the implanted dose of second dopant impurities is less than ⅔ of the dose used for implantation of the first dopant impurities in the GaN-base semiconductor material layer.

7. The fabrication method according to claim 4, wherein implantation of the second dopant impurities is performed by means of an ion gun at a temperature comprised between 20 and 700° C., preferentially equal to 500° C., and at an energy comprised between 10 and 150 keV.

8. The fabrication method according to claim 4, wherein implantation of the second dopant impurities is performed by immersion in a nitrogen plasma at a temperature comprised between 20 and 700° C., preferentially equal to 500° C., and at an energy comprised between 5 and 40 keV.

9. The fabrication method according to claim 4, wherein implantation of the second dopant impurities is followed by a second heat treatment performed in an atmosphere containing nitrogen and devoid of hydrogen and oxygen.

10. The fabrication method according to claim 9, wherein the second heat treatment is performed at a temperature comprised between 600 and 850° C.

11. The fabrication method according to claim 9, wherein the second heat treatment is performed at a temperature equal to 750° C.

12. The fabrication method according to claim 4, wherein implantation of the second dopant impurities is performed by means of an ion gun at a temperature equal to 500° C., and at an energy equal to 50 keV.

13. The fabrication method according to claim 4, wherein implantation of the second dopant impurities is performed by immersion in a nitrogen plasma at a temperature equal to 500° C., and at an energy equal to 30 keV.

14. The fabrication method according to claim 1, further comprising a deposition step of an additional layer of GaN-base semiconductor material by epitaxial growth on the semiconductor material layer.

15. The fabrication method according to claim 14, wherein the additional semiconductor material layer has a thickness comprised between 1 and 40 nm.

16. The fabrication method according to claim 14, wherein deposition of the additional semiconductor material layer is followed by a third heat treatment performed in an atmosphere containing nitrogen and devoid of hydrogen and oxygen.

17. The fabrication method according to claim 16, wherein the third heat treatment is performed at a temperature comprised between 750 and 900° C.

18. The fabrication method according to claim 16, wherein the third heat treatment is performed for a period comprised between 15 and 120 min.

19. The fabrication method according to claim 16, wherein the third heat treatment is performed at a temperature equal to 800° C.

20. The fabrication method according to claim 14, wherein the additional semiconductor material layer has a thickness comprised between 1 and 20 nm.

21. The fabrication method according to claim 14, wherein the additional semiconductor material layer has a thickness equal to 5 nm.

22. The fabrication method according to claim 1, wherein the part of the semiconductor material layer which is eliminated has a thickness comprised between 1 and 40 nm.

23. The fabrication method according to claim 1, wherein the first heat treatment is performed at a temperature equal to 750° C.

24. The fabrication method according to claim 1, wherein the first heat treatment is performed for a period equal to 20 min.

* * * * *